(12) United States Patent
Zitzlsperger et al.

(10) Patent No.: US 9,620,694 B2
(45) Date of Patent: Apr. 11, 2017

(54) OPTOELECTRONIC COMPONENT (71) Applicant: OSRAM Opto Semiconductors GmbH, Regensburg (DE)

(72) Inventors: Michael Zitzlsperger, Regensburg (DE); Matthias Goldbach, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/102,904

(22) PCT Filed: Dec. 10, 2014

(86) PCT No.: PCT/EP2014/077182
§ 371 (c)(1),
(2) Date: Jun. 9, 2016

(87) PCT Pub. No.: WO2015/086665
PCT Pub. Date: Jun. 18, 2015

(65) Prior Publication Data
US 2016/0308102 A1 Oct. 20, 2016

(30) Foreign Application Priority Data
Dec. 11, 2013 (DE) .......... 10 2013 225 552

(51) Int. Cl.
*H01L 33/62* (2010.01)
*H01L 33/48* (2010.01)
*H01L 33/54* (2010.01)

(52) U.S. Cl.
CPC .......... *H01L 33/62* (2013.01); *H01L 33/486* (2013.01); *H01L 33/54* (2013.01); *H01L 2224/32245* (2013.01); *H01L 2224/48091* (2013.01); *H01L 2224/48247* (2013.01); *H01L 2224/48471* (2013.01); *H01L 2224/48479* (2013.01);
(Continued)

(58) Field of Classification Search
CPC ....... H01L 33/62; H01L 33/54; H01L 33/486; H01L 2933/0033; H01L 2933/0066; H01L 2933/005; H01L 2224/48479; H01L 2224/32245; H01L 2224/48247; H01L 2224/48091; H01L 2224/48471
See application file for complete search history.

(56) References Cited

U.S. PATENT DOCUMENTS 8,519,426 B2* 8/2013 Lee ............... H01L 33/486
257/100
8,890,297 B2* 11/2014 Won ............... H01L 33/48
257/100
2006/0180824 A1 8/2006 Kim et al.
(Continued)

FOREIGN PATENT DOCUMENTS

DE 10 2010 023 815 A1 12/2011
DE 11 2011 103 147 T5 7/2013
(Continued)

*Primary Examiner* — David Vu
(74) *Attorney, Agent, or Firm* — DLA Piper LLP (US)

(57) ABSTRACT

An optoelectronic component includes a leadframe, a molded body connected to the leadframe, and an optoelectronic semiconductor chip arranged on the leadframe, wherein the leadframe includes an alignment opening, and wherein the molded body includes a recess via which the leadframe is exposed in the area of the alignment opening.

16 Claims, 3 Drawing Sheets (52) U.S. Cl.
CPC *H01L 2933/005* (2013.01); *H01L 2933/0033* (2013.01); *H01L 2933/0066* (2013.01)

(56) References Cited

U.S. PATENT DOCUMENTS

| | | |
|---|---|---|
| 2006/0220048 A1 | 10/2006 | Matsumoto et al. |
| 2007/0235845 A1 | 10/2007 | Xuan et al. |
| 2010/0053929 A1 | 3/2010 | Bisberg |
| 2012/0138967 A1 | 6/2012 | Shimizu et al. |

FOREIGN PATENT DOCUMENTS

| | | |
|---|---|---|
| DE | 10 2012 207 519 A1 | 11/2013 |
| EP | 2 325 901 A1 | 5/2011 |
| JP | 2006-278934 A | 10/2006 |

* cited by examiner

OPTOELECTRONIC COMPONENT

TECHNICAL FIELD

This disclosure relates to an optoelectronic component and to a method of producing an optoelectronic component.

BACKGROUND

An optoelectronic component may comprise one or a plurality of optoelectronic semiconductor chips and a carrier serving as a housing. The semiconductor chips may be configured to generate a light radiation. The semiconductor chips may be light emitting diode (LED) chips. Conversion elements for radiation conversion may be arranged on the light emitting diode chips. The carrier may comprise a leadframe with a molded body injection-molded around it, the leadframe forming rear-side connection faces. In this configuration, the component is suitable for surface mounting (SMT, surface-mounting technology). In this case, the component may be placed onto a printed circuit board printed with solder, and a reflow soldering process may be carried out to solder the component onto the printed circuit board. In the soldering process, the SMT component may float into a final position on the printed circuit board.

A surface-mountable optoelectronic component may be used, for example, in a front headlight of a motor vehicle or in a projector. In such applications, the component may be combined with a secondary optical unit disposed downstream. Endeavors are usually made to arrange the secondary optical unit with a high accuracy in relation to the light emitting faces of the component. To achieve smaller tolerances and to suppress deviations owing to floating during soldering, consideration may be given to positioning the component as precisely as possible on the printed circuit board and to fixing it during the soldering process. The position of the light emitting faces (usually of the semiconductor chips) is crucial. The latter often cannot be detected accurately with the aid of image recognition. Therefore, use is made of other features, for example, markings on the molded body, component edges or the like, on the basis of which the positioning is performed. However, such features may likewise fluctuate in their position relative to the semiconductor chips, as a result of which a non-optimum tolerance chain may arise overall.

It could therefore be helpful to provide an improved optoelectronic component.

SUMMARY

We provide an optoelectronic component including a leadframe, a molded body connected to the leadframe, and an optoelectronic semiconductor chip arranged on the leadframe, wherein the leadframe includes an alignment opening, and the molded body includes a recess via which the leadframe is exposed in the area of the alignment opening.

We also provide a method of producing the optoelectronic component including a leadframe, a molded body connected to the leadframe, and an optoelectronic semiconductor chip arranged on the leadframe, wherein the leadframe includes an alignment opening, and the molded body includes a recess via which the leadframe is exposed in the area of the alignment opening, including providing a leadframe including an alignment opening; forming a molded body connected to the leadframe, wherein the molded body includes a recess via which the leadframe is exposed in the area of the alignment opening; and arranging an optoelectronic semiconductor chip on the leadframe.

We further provide an optoelectronic component including a leadframe, a molded body connected to the leadframe, and an optoelectronic semiconductor chip arranged on the leadframe, wherein the leadframe includes an alignment opening, the molded body includes a recess via which the leadframe is exposed in the area of the alignment opening, and the molded body includes a further recess exposing the leadframe within which further recess the optoelectronic semiconductor chip is arranged on the leadframe.

LIST OF REFERENCE SIGNS

100, 101 Component
110 Leadframe
111, 112 Leadframe section
113, 114 Leadframe section
115, 116 Leadframe section
117 Leadframe section
119 Cutout
125 Connection face
130 Alignment opening
135 Depression
140 Molded body
141, 143 Recess
146, 147 Recess
150 Semiconductor chip
155 Conversion element
158 Connection layer
159 Bond wire
160 Potting compound
241, 242 Partial area
243 Partial area

DETAILED DESCRIPTION

Our optoelectronic component may comprise a leadframe, a molded body connected to the leadframe, and an optoelectronic semiconductor chip arranged on the leadframe. The leadframe comprises an alignment opening. The molded body comprises a recess via which the leadframe is exposed in the area of the alignment opening.

The optoelectronic component, which may be suitable for surface mounting (SMT, surface-mounting technology), may be employed, for example, in a front headlight of a motor vehicle or in a projector. With regard to such possible applications, the component is configured to emit light radiation. In this case, the optoelectronic semiconductor chip of the component is configured to generate a light radiation. Alternatively, an example of the component in which the optoelectronic semiconductor chip is configured detects or absorb light radiation.

The component may be formed such that the optoelectronic semiconductor chip arranged on the leadframe and the alignment opening present at the leadframe comprise an accurate position with respect to one another. This may be utilized in multiple ways to enable a precise alignment with a short tolerance chain.

The optoelectronic component may be soldered onto a printed circuit board with a high accuracy, for example. For this purpose, the component may be placed onto the printed circuit board precisely with the aid of the alignment opening, and may be fixed during a reflow soldering process. In this way, the optoelectronic semiconductor chip may adopt a predefined position on the printed circuit board with high accuracy. With regard to a configuration of the semiconductor chip that generates light radiation, it is correspondingly possible for a light emitting face provided by the semiconductor chip to adopt a predefined position on the printed circuit board.

The alignment opening may furthermore be employed to arrange, on the basis thereof, a further component part with a high accuracy with respect to the semiconductor chip. By way of example, the alignment opening may be used, in a configuration of the semiconductor chip that generates light radiation, to arrange a secondary optical unit precisely with respect to a light emitting face provided by the semiconductor chip.

The presence of a defined relative position between the optoelectronic semiconductor chip and the alignment opening of the leadframe may be realized in various ways. It is possible, for example, in a process of arranging the semiconductor chip on the leadframe carried out during production of the component, to directly align the semiconductor chip at the alignment opening. A shortest possible tolerance chain may be obtained as a result.

The optoelectronic component may also be produced such that a process of arranging the optoelectronic semiconductor chip on the leadframe is carried out using at least one other alignment structure of the leadframe no longer present in the completed component. The alignment opening may be produced together with the other alignment structure and may therefore comprise an accurate position, if appropriate with a minimal tolerance deviation, with respect to the other alignment structure. This therefore correspondingly holds true for the relative position between the alignment opening and the semiconductor chip.

A further advantage is that the configuration of the optoelectronic component with the alignment opening cannot result in additional manufacturing costs compared to a conventional component (without an alignment opening). This is because the alignment opening may be produced together with the rest of the structure of the leadframe in the context of the production of the component.

The alignment opening may furthermore be used to fix the optoelectronic component. The fixing may be carried out on a printed circuit board on which the optoelectronic component may be arranged. The fixing may be produced, for example, by a screw, a pin or some other fixing means insertable into the alignment opening.

The alignment opening or the recess of the molded body via which the alignment opening is exposed may furthermore be used, for example, to align a further component part, for example, a secondary optical unit, mechanically at the optoelectronic component and/or to fix it to the component. For this purpose, for example, an alignment pin or some other suitable alignment or fixing structure insertable into the recess or into the alignment opening may be present at the component part or secondary optical unit.

Further possible examples of the optoelectronic component are described in greater detail below.

The alignment opening of the leadframe may be circular. Accurate alignment may be fostered as a result. This is because the midpoint of the circular alignment opening may be used as a reference point for alignment. The position of the midpoint may be independent of the size of the alignment opening.

However, it is also possible for the alignment opening to comprise a shape deviating from a circular shape. One possible example is a cruciform shape.

The recess of the molded body via which the alignment opening of the leadframe is visible such that this may be used for alignment may comprise various shapes. By way of example, a round, for example, a circular or an oval geometry is possible. Such a configuration enables simple production of the optoelectronic component. By way of example, the molded body may be produced with the aid of a molding process. A round recess enables simple release from the mold after the molding process.

The molded body may comprise a further recess exposing the leadframe. Within this recess, the optoelectronic semiconductor chip may be arranged on the leadframe.

The optoelectronic semiconductor chip may be a light emitting diode (LED) chip configured to generate a light radiation. If appropriate, a conversion element for radiation conversion may be arranged on the semiconductor chip.

The optoelectronic component may comprise a plurality of optoelectronic semiconductor chips, for example, two thereof. The plurality of semiconductor chips may correspondingly comprise a defined accurate position with respect to the alignment opening. The plurality of semiconductor chips may be arranged in a common recess of the molded body on the leadframe. The plurality of semiconductor chips may be configured to generate or to detect a light radiation. In a configuration of the semiconductor chips that generates radiation, a dedicated conversion element for radiation conversion may be arranged on each of the semiconductor chips.

The leadframe may comprise a plurality of leadframe sections or be structured into a plurality of leadframe sections. The plurality of leadframe sections or a portion thereof may be electrically isolated from one another and mechanically connected via the molded body. The plurality of leadframe sections may form connection faces at a rear side of the optoelectronic component with which connection faces the component may be soldered onto a printed circuit board. The alignment opening may be produced, as indicated above, together with the rest of the structuring of the leadframe and thus together with the rear-side connection faces of the component.

The alignment opening may be situated in the area of a connection face.

The alignment opening may be produced at a separate leadframe section formed only for the alignment opening. However, it is also possible for the alignment opening to be produced at a leadframe section which, for example, also carries and/or contacts a semiconductor chip. For this purpose, consideration may be given to the following configurations.

The leadframe may comprise a first leadframe section and a second leadframe section. The optoelectronic semiconductor chip is arranged at least on the first leadframe section.

With regard to the example mentioned above, the optoelectronic semiconductor chip may comprise a front-side contact and a rear-side contact, and the semiconductor chip is arranged on the first leadframe section. With the rear-side contact, the semiconductor chip may electrically and mechanically connect to the first leadframe section. A connection may be produced by a suitable connection via, for example, a solder layer or a layer of an electrically conductive adhesive. The front-side contact of the semiconductor chip may electrically connect to the second leadframe section by a suitable connection structure, for example, in the form of a bond wire.

For the optoelectronic semiconductor chip, consideration may also be given to other configurations. The semiconductor chip may comprise two front-side contacts, for example. In this case, the semiconductor chip may be arranged on the first leadframe section and one of the two front-side contacts may electrically connect to the first leadframe section by a connection structure. The other of the two front-side contacts may electrically connect to the second leadframe section by a further connection structure. The connection structures may be present in the form of bond wires.

The optoelectronic semiconductor chip may furthermore comprise two rear-side contacts, for example. In this case, the semiconductor chip may be a so-called flip-chip. In this configuration, the semiconductor chip may be arranged on the first leadframe section and the second leadframe section. With one of the rear-side contacts, the semiconductor chip may electrically and mechanically connect to the first leadframe section and, with the other rear-side contact, the semiconductor chip may electrically and mechanically connect to the second leadframe section. The connection may be produced by a suitable connection layer, for example, a solder layer or a layer of an electrically conductive adhesive.

If the optoelectronic component comprises a plurality of optoelectronic semiconductor chips, the leadframe of the component may comprise a number of leadframe sections suitable therefor or a plurality of first and second leadframe sections for the plurality of semiconductor chips. Each semiconductor chip may be arranged on at least one leadframe section and electrically connect to two leadframe sections in the manner described above.

The alignment opening may be formed at one of the first leadframe section and the second leadframe section or at one of the first leadframe sections and second leadframe sections.

Furthermore, it is possible for the leadframe to comprise a further leadframe section at which the alignment opening is formed. In this configuration, consideration may be given to not using the further leadframe section for soldering during a process of soldering the optoelectronic component onto a printed circuit board.

The leadframe may comprise a plurality of alignment openings. It is possible to carry out alignment processes mentioned above, for example, alignment of the optoelectronic semiconductor chip or the optoelectronic semiconductor chips on the leadframe, alignment of the optoelectronic component on a printed circuit board and/or alignment of a further component part or of a secondary optical unit with respect to the component, on the basis of all of the plurality of alignment openings of the component. As a result, an alignment process may be carried out with high accuracy and reliability. The plurality of alignment openings of the leadframe may each be circular, for example. Furthermore, the leadframe of the component may be formed with three alignment openings, for example.

In the configuration of the optoelectronic component comprising a plurality of alignment openings, features and details described above with respect to an (individual) alignment opening may be applied analogously. Furthermore, it is possible for a portion or all of the plurality of alignment openings to be provided on different leadframe sections. It is also possible for a portion or all of the plurality of alignment openings to be formed at a common leadframe section. Furthermore, for a plurality of alignment openings, respectively dedicated exposing recesses may be formed in the molded body, or, for a portion or for all of the plurality of alignment openings, a common recess may be provided in the molded body.

The leadframe may be formed by etching. The alignment opening(s) may be produced together with the rest of the structure of the leadframe, in the course of the etching. As a result, the alignment opening(s) may be defined and thereby positioned with a high accuracy at the leadframe.

The optoelectronic component may comprise further component parts. By way of example, a recess of the molded body within which at least one semiconductor chip may be arranged may be filled with a potting compound. This may be a reflective potting compound. The recess may be filled with the reflective potting compound such that only a front side of the at least one semiconductor chip or of at least one conversion element arranged thereon is exposed. What may be achieved as a result is that, during operation of the component configured to emit light, light emission takes place only via the front side(s).

We also provide a method of producing an optoelectronic component. The component comprises the construction described above or a construction in accordance with one or a plurality of the configurations described above. The method comprises providing a leadframe. The leadframe provided comprises an alignment opening. The method furthermore comprises forming a molded body connected to the leadframe. The molded body comprises a recess via which the leadframe is exposed in the area of the alignment opening. The method furthermore comprises arranging an optoelectronic semiconductor chip on the leadframe.

The optoelectronic component produced in accordance with the method may prove to be advantageous from multiple standpoints. The alignment opening and the optoelectronic semiconductor chip may comprise an accurate position with respect to one another. It is therefore possible, on the basis of the alignment opening, to perform a precise mounting of the component on a printed circuit board with a predefined position of the semiconductor chip on the printed circuit board. With the aid of the alignment opening, it is furthermore possible to position a further component part such as a secondary optical unit, for example, with a high accuracy relative to the semiconductor chip.

When arranging the optoelectronic semiconductor chip on the leadframe, the alignment opening of the leadframe may be used to align the optoelectronic semiconductor chip. If the alignment opening, as indicated above, is also used when arranging the optoelectronic component on a printed circuit board and when positioning a further component part or secondary optical unit, a shortest possible tolerance chain may be made available in this way.

Providing the leadframe may comprise providing a metallic initial layer and structuring the metallic initial layer. The leadframe produced as a result may comprise a plurality of leadframe sections. The alignment opening is formed during the structuring. As a result, the alignment opening may be defined with a high accuracy at the leadframe.

This relates, for example, to a possible configuration in which structuring comprises front-side and rear-side etching of the metallic initial layer. In this case, the alignment opening is formed by the rear-side etching. Rear-side connection faces of the leadframe may be formed simultaneously by the rear-side etching, with which rear-side connection faces the component may be soldered onto a printed circuit board. Consequently, the alignment opening may be produced with an accurate position with respect to the connection faces.

Providing and/or structuring the leadframe may alternatively also be carried out in other ways. By way of example, mechanical structuring of the metallic initial layer is possible, wherein processes such as stamping and/or embossing, for example, may be used. In this way, too, the alignment opening may be formed together with the rest of the structuring of the leadframe and thus together with rear-side connection faces of the leadframe.

After structuring, a process of coating the leadframe with a metallic coating may furthermore be carried out. The coating may be produced by electrochemical deposition or electroplating, for example. On account of the coating, the leadframe may be suitable for soldering and connecting a bond wire. Forming the coating may be taken into consideration, for example, for a metallic initial layer composed of copper. The coating may comprise, for example, a layer stack composed of Ni, Pd, Au.

Forming the molded body may comprise injection molding a housing compound or molding compound composed of a plastics material around the structured leadframe. A molding process may be carried out for this purpose. In this configuration, the arrangement of leadframe and molding compound may be a so-called premold housing.

Further features and details explained above with regard to the optoelectronic component may likewise be employed in the production method. For example, it is possible to provide the leadframe with a plurality of alignment openings such that precise alignment may be performed on the basis of the plurality of alignment openings of the component. Furthermore, the component may be realized with a plurality of optoelectronic semiconductor chips. The molded body may be formed such that the molded body comprises a further recess exposing the leadframe, within which further recess the semiconductor chip or the semiconductor chips may be arranged on the leadframe. The further recess may be filled with a potting compound, for example, a reflective potting compound.

With regard to the method, attention is furthermore drawn to the possibility of carrying out the method such that a continuous assemblage comprising a plurality of optoelectronic components each comprising at least one optoelectronic semiconductor chip is produced. In this case, the leadframe may be provided with a plurality of alignment openings assigned to the individual components. A component may be assigned one or a plurality of alignment openings. Furthermore, the molded body may be produced with a plurality of recesses for the alignment openings and for the semiconductor chips. After the continuous assemblage has been produced, the assemblage may be singulated into separate optoelectronic components.

During parallel production of a plurality of optoelectronic components in the assemblage, the leadframe may be provided with additional alignment structures assigned to all the components to define the position of the semiconductor chips. Such global or universal alignment structures may likewise be present in the form of openings in the leadframe. The universal alignment structures may be formed together with the alignment openings individually assigned to the components, as a result of which these may be positioned with a small tolerance deviation with respect to one another. Arranging semiconductor chips on the leadframe may be carried out using the universal alignment structures. Since the universal alignment structures and the individual alignment openings may be positioned accurately with respect to one another, in this way the semiconductor chips may also adopt an accurate position with respect to the individual alignment openings of the components. During singulation, not only may the components be separated, but a portion of the assemblage with the universal alignment structures may also be separated from the components. Since the semiconductor chips and the alignment openings of the components may be precisely positioned with respect to one another, the alignment openings may be used in the context of precise alignment.

Alternatively, it is possible to carry out the process of arranging the semiconductor chips on the leadframe with the aid of the individual alignment openings of the components. A process of forming the leadframe with universal alignment structures may be obviated in this way.

The advantages, examples and developments explained above may be employed (apart from in cases of clear dependencies or incompatible alternatives, for example) individually or alternatively in any desired combination with one another.

The above-described properties, features and advantages and the way in which they are achieved will become clearer and more clearly understood in association with the following description of examples explained in greater detail in association with the schematic drawings.

Possible examples of surface-mountable optoelectronic components are described with reference to the following figures. They are configured to enable alignment with a high accuracy and reliability. This includes, for example, precise mounting on a printed circuit board. A further example is accurate arrangement of a secondary optical unit.

The examples shown in the figures and described below may be produced with the aid of processes known from semiconductor technology and from the fabrication of optoelectronic components. Customary materials in this field may also be used, and will therefore be discussed only in part. In the same way, it is possible that, alongside component parts shown and described, further component parts and structures may be present in the components. It is furthermore pointed out that the figures are merely of schematic nature and are not true to scale. In this sense, component parts and structures shown in the figures may be illustrated with exaggerated size or size reduction to afford a better understanding.

Figure 1:
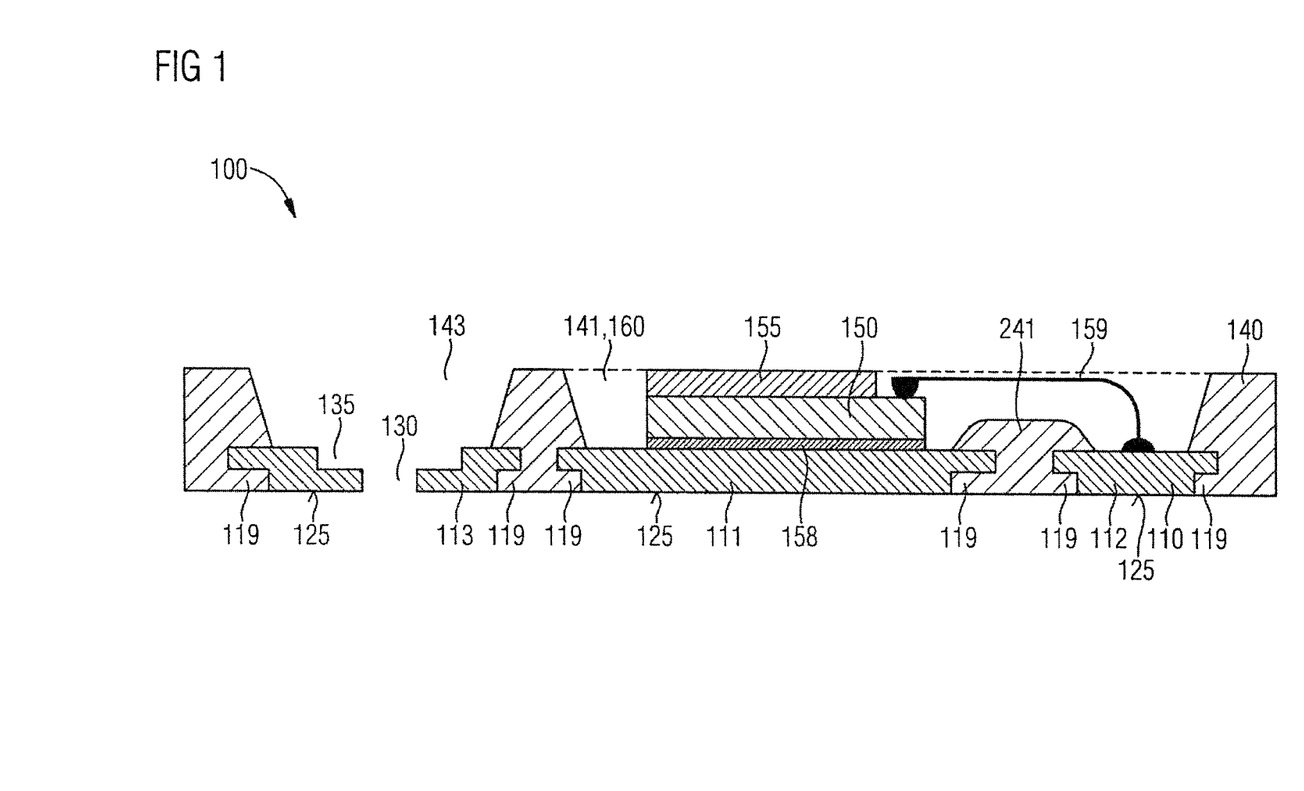
FIG. 1 shows a lateral illustration of an optoelectronic component having an alignment opening in a separate section of a leadframe.
Figure 2:
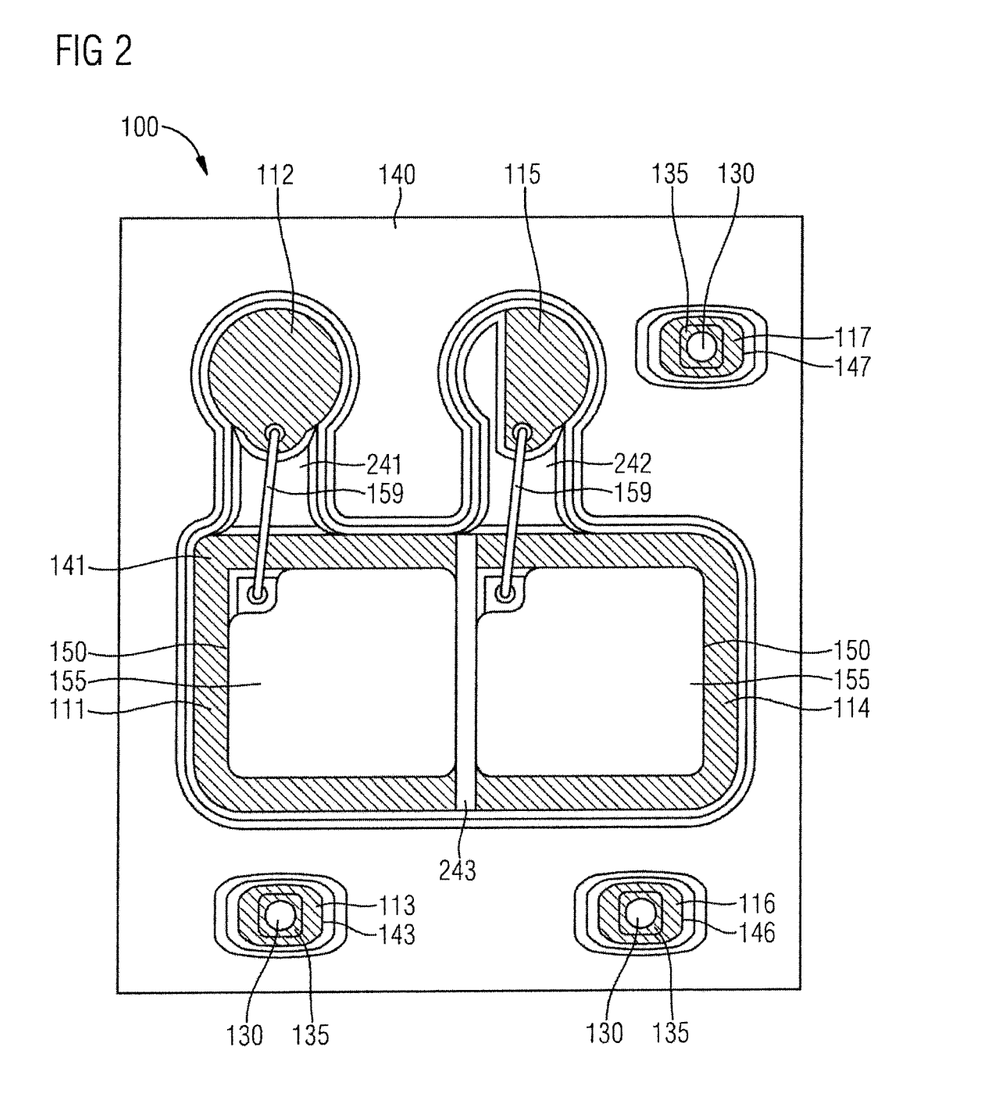
FIG. 2 shows a plan view illustration of a front side of the optoelectronic component from FIG. 1.

FIG. 1 shows a schematic lateral illustration of a surface-mountable optoelectronic component 100. A schematic plan view illustration of a front side of the component 100 is shown in FIG. 2. The SMT component 100, which is in the form of a so-called package, comprises two optoelectronic semiconductor chips 150 that generate light radiation and a carrier serving as a housing. The carrier comprises a metallic leadframe 110 with a housing body or molded body 140 injection-molded around it.

The metallic leadframe 110 comprises a plurality of leadframe sections 111, 112, 113, 114, 115, 116, 117. As shown in FIG. 2, the leadframe sections 111, 112, 113, 114, 115, 116, 117 are partly concealed by the molded body 140 (and the semiconductor chips 150). The leadframe sections 111, 112, 113, 114, 115, 116, 117 may be electrically isolated from one another and mechanically connected via the molded body 140.

The four leadframe sections 111, 112, 114, 115 carry and electrically connect the two semiconductor chips 150 (cf. FIG. 2). An alignment opening 130, which is circular in plan view, is formed at the other three leadframe sections 113, 116, 117. The three alignment openings 130 of the component 100 may be employed with regard to precise alignment.

This may make use of the fact that the alignment openings 130 may comprise a minimal tolerance deviation with respect to structures used during production of the component 100 to determine or define the position of the semiconductor chips 150 in the component 100. Further details in this respect are described in even greater detail further below.

A configuration for the three leadframe sections 111, 112, 113 present in the area of the left-hand side of the component 100 in FIG. 2 is shown schematically from the side in FIG. 1. The leadframe sections 111, 112, 113 terminate flush with the molded body 140 at a rear side of the component 100 and form exposed connection faces 125 (soldering pads) in this area. Furthermore, the leadframe sections 111, 112, 113 are formed in a stepped fashion laterally at the edge and comprise marginal or marginally circumferentially extending cutouts 119. This structure enables an intermeshing of the molded body 140 on the leadframe 110, and thus a mechanically fixed connection. The molded body 140 or partial areas thereof adjoin the leadframe sections 111, 112, 113 marginally and in the area of the cutouts 119, as is shown in FIG. 1, and may also cover a portion of the leadframe sections 111, 112, 113 on the front side at the edge. A comparable configuration (marginal stepped shape, exposed connection faces 125 or the like) is also present in the other leadframe sections 114, 115, 116, 117, not shown from the side. Via the connection faces 125 of the leadframe sections 111, 112, 113, 114, 115, 116, 117, the leadframe 110 and thus the component 100 may be soldered onto a printed circuit board (not illustrated).

As shown in FIG. 2, the molded body 140 comprises four recesses 141, 143, 146, 147, as a result of which the leadframe sections 111, 112, 113, 114, 115, 116, 117 are partly exposed at a front side opposite to the rear side. With respect to the three leadframe sections 113, 116, 117 provided with the alignment openings 130, the molded body 140 comprises three associated recesses or cavities 143, 146, 147 (also cf. FIG. 1 for the leadframe section 113). The recesses 143, 146, 147 comprise a round or oval geometry in plan view. Via the recesses 143, 146, 147, the leadframe sections 113, 116, 117 are exposed in the area of the alignment openings 130. In this way, the alignment openings 130 are visible at the front side or chip side and may be used for alignment.

Via the further recess 141, the leadframe sections 111, 112, 114, 115 used to carry and connect the semiconductor chips 150 are partly exposed on the front side. The recess 141 comprises a more complex contour compared with the other recesses 143, 146, 147 in plan view. The recess 141 comprises a rectangular partial area exposing the leadframe sections 111, 114, and two partial areas extending in the direction of the other leadframe sections 112, 115 (i.e., upward in FIG. 2) and exposing the leadframe sections 112, 115.

It becomes clear with reference to FIG. 1 that the leadframe sections 111, 112 provided for one of the semiconductor chips 150 are exposed on the front side via the recess 141 of the molded body 140. FIG. 1 furthermore shows that a partial area 241 of the molded body 140 connected to the leadframe sections 111, 112 is present in the area of the recess 141 and in an area adjoining or between the leadframe sections 111, 112. The partial area 241 of the molded body 140 comprises a smaller height or layer thickness than a part of the molded body 140 that surrounds the recess 141.

A comparable partial area 242 of the molded body 140 in the area of the recess 141 having the same (smaller) layer thickness is also present between the other leadframe sections 114, 115 and connected thereto (shown only in FIG. 2). The partial areas 241, 242 of the molded body 140 comprise different contours in plan view.

As furthermore shown in FIG. 2, a further partial area 243 of the molded body 140 is situated between the leadframe sections 111, 114 of the leadframe 110. The partial area 243 of the molded body 140 comprises a thin strip-shaped contour in plan view. The partial area 243 may terminate flush with the leadframe sections 111, 114 on the front side.

The optoelectronic semiconductor chips 150 of the component 100 are configured to generate a light radiation. As shown in FIG. 2, a laminar conversion element 155 for radiation conversion is arranged on each of the semiconductor chips 150. The conversion elements 155 may be fixed on the semiconductor chips 150 with the aid of a radiation-transmissive adhesive. The optoelectronic semiconductor chips 150 may be light emitting diode chips. The semiconductor chips 150 may be surface emitters produced by thin-film technology and in which a significant part of the generated radiation may be emitted via a front-side face (light emission side) and may thereby be coupled into the conversion elements 155 arranged at this location.

The optoelectronic semiconductor chips 150 may be produced in a customary manner and comprise component parts (not shown) such as a semiconductor layer sequence having an active zone that generates radiation. The semiconductor chips 150 furthermore comprise a rear-side contact and a front-side contact, via which electrical energy to generates radiation may be fed to the semiconductor chips 150. The rear-side contacts arrange the semiconductor chips 150 on the leadframe 110. The front-side contacts indicated in FIG. 2 are present as bond pads for connecting bond wires 159.

FIG. 1 shows a contacting for one of the semiconductor chips 150 (on the left in FIG. 2) from the side. The relevant semiconductor chip 150 is arranged on the front side on the lead-frame section 111. In this case, the rear-side contact of the semiconductor chip 150 electrically and mechanically connects to the leadframe section 111 by a connection layer 158. The connection layer 158 is, for example, a solder layer or a layer of an electrically conductive adhesive. The front-side contact of the semiconductor chip 150 connects to the leadframe section 112 by a bond wire 159. The bond wire 159 extends above the partial area 241 of the molded body 140. Comparable conditions are present with regard to the other of the two semiconductor chips 150 (cf. on the right in FIG. 2). This semiconductor chip 150 is arranged with the associated rear-side contact on the leadframe section 114. Furthermore, the front-side contact of the semiconductor chip 150 connects to the leadframe section 115 by a further bond wire 159. The bond wire 159 extends above the other partial area 242 of the molded body 140.

The conversion elements 155 arranged on the front side on the semiconductor chips 150 each comprise a cutout at a corner as shown in FIG. 2. In this way, the front-side contacts of the semiconductor chips 150, formed at the corners of the semiconductor chips 150, are freely accessible for contacting with the bond wires 159.

A light radiation generated in a primary fashion by the semiconductor chips 150 may be at least partly converted with the aid of the conversion elements 155. The primary light radiation emitted by the semiconductor chips 150 may be a blue light radiation, for example. By the conversion elements 155, the primary light radiation may be at least partly converted into one or a plurality of light radiations in one other or a plurality of other wavelength ranges, for example, in the green to red spectral range. In this way, a light radiation having a desired color, for example, a white light radiation, may be generated that may be emitted via the conversion elements 155. In this configuration, the component 100 may be employed, for example, in a front headlight of a motor vehicle.

Consideration may furthermore be given to forming the optoelectronic component 100 such that radiation is emitted only via front sides of the conversion element 155. This may be achieved by the recess 141 of the molded body 140 being filled with a reflective potting compound 160, as indicated on the basis of the dashed line in FIG. 1. The potting compound 160 may comprise a radiation-transmissive basic material, for example, silicone and reflective particles, for example, $TiO_2$ particles, contained therein. The semiconductor chips 150 and conversion elements 155 are surrounded by the potting compound 160 such that only the front sides of the conversion elements 155 are exposed. The potting compound 160 extends as far as the front sides of the conversion elements 155 and is also present between the semiconductor chips 150 and conversion elements 155.

With regard to FIG. 1, the molded body 140 outside the recess 141 may comprise a larger thickness in a departure from the illustration chosen in FIG. 1. In this case, the molded body 140 may project beyond the front sides of the conversion elements 155 and thus the potting compound 160.

One possible method of producing an optoelectronic component 100 is described below. The method involves forming a continuous assemblage comprising a plurality of components 100 of identical type, which is subsequently singulated. Aspects already mentioned above concerning individual component parts of the component and structures will not be described in detail again. Instead, reference is made to the above description.

In the method, a metallic initial layer composed of copper is provided. The initial layer is structured into a leadframe 110. The structured leadframe 110 comprises leadframe sections 111, 112, 113, 114, 115, 116, 117 for each of the components 100 to be produced, and connection structures that hold together the leadframe sections 111, 112, 113, 114, 115, 116, 117 (not illustrated). In this case, leadframe sections 111, 112, 113, 114, 115, 116, 117 of different components 100 are connected in a suitable manner.

The structuring is carried out by front-side and rear-side etching of the metallic initial layer. The lateral stepped shape (explained with reference to FIG. 1) of the leadframe sections 111, 112, 113, 114, 115, 116, 117 with the cutouts 119 is produced in this way. The shape of the soldering or connection faces 125 is defined by the rear-side etching.

In the leadframe sections 113, 116, 117, depressions 135 are formed by the front-side etching (cf. FIG. 1 for the leadframe section 113). The front-side depressions 135 may be rectangular (cf. FIG. 2). The front-side depressions 135 comprise larger lateral dimensions than the alignment openings 130. The alignment openings 130 are formed by the rear-side etching and thus together with the rear-side connection faces 125. In this way, the alignment openings 130 may be produced with an accurate position with respect to the connection faces 125.

It is possible for the structured leadframe 110 to comprise one or a plurality of further sections (for example, at the edge) provided with global or universal alignment structures (not illustrated). The universal alignment structures may likewise be present in the form of openings and be produced by the rear-side etching. In this way, the universal alignment structures and the (in each case three) alignment openings 130 associated with the individual components 100 may be positioned precisely and with a small tolerance deviation with respect to one another.

After structuring, the leadframe 110 composed of copper is provided with a metallic coating by electroplating (not illustrated). This ensures that the leadframe 110 is suitable for soldering and connection of bond wires 159. The coating may be a layer stack composed of Ni, Pd, Au.

Afterward, a molded body 140 connected to the leadframe 110 is produced. A molding process is carried out for this purpose in which molding process a molding or housing compound composed of a suitable insulating plastics material and forming the molded body 140 is injection-molded around the leadframe 110. The molded body 140 comprises per component 100 four recesses 141, 143, 146, 147 via which the leadframe 110 is partly exposed on the front side. The oval or round configuration of the recesses 143, 146, 147, but also of the recess 141 having partly round corners or edges (cf. FIG. 2) enables simple removal from the mold after the molding process.

Processes such as arranging optoelectronic semiconductor chips 150 on the leadframe sections 111, 114 of the leadframe 110, arranging conversion elements 155 on the semiconductor chips 150, connecting bond wires 159, and filling the recesses 141 with a potting compound 160 are subsequently carried out. Afterward, the continuous assemblage is singulated to separate optoelectronic components 100. The molded body 140 and the leadframe 110 or the connection structures of the leadframe 110 are severed in the process. One or a plurality of parts of the leadframe 110 having the universal alignment structures mentioned above are likewise separated.

It is possible to carry out the process of arranging the semiconductor chips 150 on the leadframe 110 using the universal alignment structures. Since the universal alignment structures are precisely produced with respect to the alignment openings 130, the alignment openings 130 for each component 100 may comprise a precise position with respect to the associated semiconductor chips 150 and thus with respect to the light emitting faces of the semiconductor chips 150 or the light emitting front-side faces of the conversion elements 155. This property enables precise alignment of a fabricated component 100.

It is furthermore possible to carry out the process of arranging the semiconductor chips 150 on the leadframe 110 directly using the alignment openings 130 individually assigned to the individual components 100. What may be achieved in this way is that the alignment openings 130 and the semiconductor chips 150 or the light emitting faces are positioned with a high accuracy with respect to one another. This enables alignment with a shortest possible tolerance chain. A process of forming the leadframe 110 with the universal alignment structures may also be obviated.

In an optoelectronic component 100 fabricated in this way, the alignment openings 130, comprising an accurate position relative to the semiconductor chips 150 may enable precise alignment from multiple standpoints.

By way of example, provision may be made for carrying out population of a printed circuit board with the optoelectronic component 100 with a high accuracy on the basis of the three alignment openings 130 (not illustrated). The printed circuit board to be populated comprises contact pads (landing pads) corresponding to the soldering pads 125. For mounting, the contact pads of the printed circuit board may be provided or printed with a solder. The component 100 may be placed by the connection faces 125 onto the printed circuit board and may electrically and mechanically connect to the printed circuit board in a reflow soldering process. An accurate positioning may be achieved by the component 100 being placed precisely onto the printed circuit board using the alignment openings 130 and being fixed during the soldering process. In this way, the semiconductor chips 150 and the light emitting faces of the component 100 may adopt a predefined position on the printed circuit board with a high accuracy.

For accurate alignment, the circular shape of the alignment openings 130 may also prove to be advantageous. This is because the midpoints of the alignment openings 130 may be used for alignment. The position of the midpoint of an alignment opening 130 is independent of the size of the relevant alignment opening 130. What may be achieved in this way is that production-dictated size deviations of the alignment openings 130 have no or a negligible influence on the precise alignment.

The alignment openings 130 may furthermore be used to fix the housing comprising leadframe 130 and molded body 140 and thus the component 100 on the printed circuit board. By way of example, screws, pins or other fixing means insertable into the alignment openings 130 may be used for fixing purposes (not illustrated).

Depending on the application, consideration may be given to combining the optoelectronic component 100 with a secondary optical unit disposed downstream of the component 100 (not illustrated). The secondary optical unit may comprise a lens and/or a reflector, for example. With the aid of the alignment openings 130 it is possible to arrange the secondary optical unit with a high accuracy with respect to the semiconductor chips 150 and thus with respect to the light emitting faces. The secondary optical unit may be arranged, for example, on the component 100, the printed circuit board or some other component part.

The alignment openings 130 and the recesses 113, 116, 117 of the molded body 140 via which the alignment openings 130 are exposed may furthermore be used to align the secondary optical unit mechanically at the optoelectronic component 100 and/or to fix it to the component 100. For this purpose, for example, alignment pins or other structures that may be inserted into the recesses 113, 116, 117 or into the alignment openings 130 may be provided at the secondary optical unit.

The optoelectronic component 100 may be produced as described above such that the leadframe sections 111, 112, 113, 114, 115, 116, 117 are separated from one another. As a result, it is possible, to solder the component 100 onto a printed circuit board, to use only the soldering pads 125 of the four leadframe sections 111, 112, 114, 115, used to carry and electrically connect the two semiconductor chips 150. By contrast, such a use may be obviated for the other three leadframe sections 113, 116, 117 provided with the alignment openings 130, or the soldering pads 125 thereof.

It is possible to realize a component in which, in a departure from the component 100, leadframe sections are partly combined or connected to one another.

Figure 3:
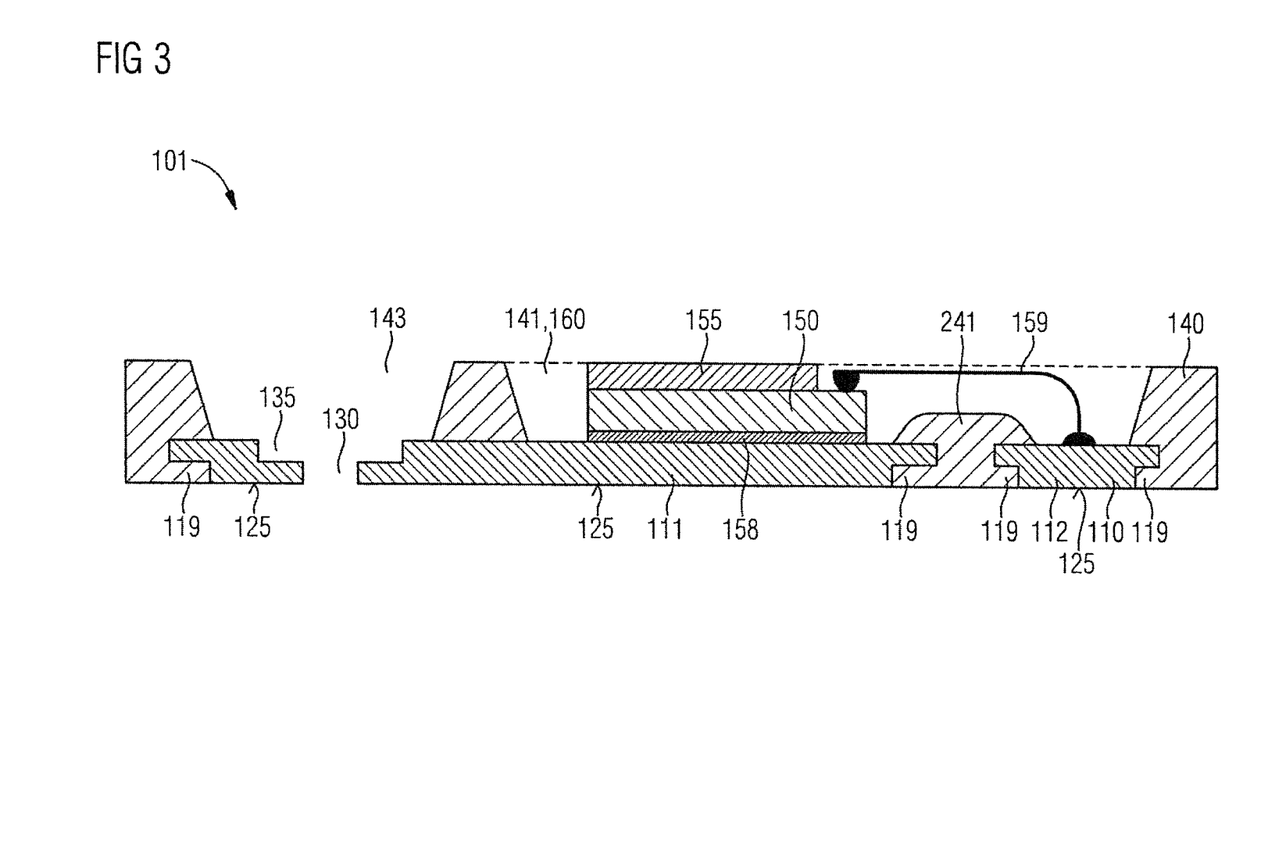
FIG. 3 shows a lateral illustration of a further optoelectronic component in which an alignment opening is formed in a section of a leadframe provided to carry a semiconductor chip.

FIG. 3 shows a schematic lateral illustration of a further optoelectronic component 101 to illustrate such a variant. The component 101 constitutes a modification of the component 100 explained above. Corresponding features and identical and identically acting component parts, possible production or the like will therefore not be described in detail again below. For details in respect thereof, reference is instead made to the description above. Furthermore, it is pointed out that the component 101 may comprise a shape comparable to FIG. 2 in plan view.

In the component 101 in FIG. 3, the leadframe section 111 is larger compared to the component 100, and additionally comprises an alignment opening 130. The leadframe section 111 carries a semiconductor chip 150. The leadframe section 111 of the component 101 corresponds to a combination of the sections 111, 113 present separately in the component 100. Furthermore, the component 101 comprises a leadframe section 112 to connect a bond wire 159.

The leadframe section 111 of the component 101 may be present in the form of a planar section, for example. Furthermore, consideration may be given to forming the component 101 such that the leadframe section 111 comprises a first partial section to carry the semiconductor chip 150 and a second partial section having the alignment opening 130. The two partial sections may connected by a suitable connection structure, illustrated only in the area shown in FIG. 3. Such configurations may also apply to further leadframe sections of the component 101.

The component 101, like the component 100, may comprise further leadframe sections, for example, the sections 114, 115 for a further semiconductor chip 150 (cf. FIG. 2). In this case, it is possible for the leadframe section 115 of the component 101 to be in the form of a connected configuration or combination of the sections 115, 117 of the component 100, and/or for the leadframe section 114 to be in the form of a connected configuration or combination of the sections 114, 116.

The structures explained with reference to the figures constitute preferred examples. Further examples which may comprise further modifications and/or combinations of features are possible besides the structures described and depicted. It is possible, for example, to use other materials instead of the materials indicated above, and to replace above indications concerning colors of light radiations by other indications.

In a further possible application, a component may comprise only one optoelectronic semiconductor chip, or else more than two optoelectronic semiconductor chips.

Other numbers may also be taken into consideration for alignment openings. A component may therefore have fewer or more than three alignment openings. A configuration of a component comprising only one alignment opening is also possible.

In this connection, attention is furthermore drawn to the possibility of forming one or a plurality of alignment openings with a structure deviating from a circular shape. One possible example is an alignment opening that is cruciform in plan view.

Furthermore, components may be realized in which other semiconductor chips are used instead of the semiconductor chips 150. They include, for example, semiconductor chips having two front-side contacts or semiconductor chips having two rear-side contacts. A semiconductor chip having two front-side contacts may be arranged on a leadframe section, and one front-side contact may connect to the same leadframe section by a bond wire. The other front-side contact may connect to another leadframe section by a further bond wire. A semiconductor chip having two rear-side contacts may be arranged with the rear-side contacts on two leadframe sections. The rear-side contacts may electrically and mechanically connect to the associated leadframe sections by the corresponding connection layers.

A further possible modification is a component comprising at least one optoelectronic semiconductor chip configured to detect or absorb a light radiation.

Modifications may be taken into consideration for a production method as well. It is possible, for example, to provide a leadframe by mechanically structuring a metallic initial layer. Processes such as stamping and/or embossing, for example, may be used in this case. In this way, too, it is possible to form alignment openings (and, if appropriate, universal alignment structures) together with the rest of the structure of the leadframe.

Furthermore, attention is drawn to the possibility that the above-described components and the possible modifications thereof may also be used in a different field than the automotive sector. Use in a projector, for example, is possible. For this purpose, consideration may be given, for example, to forming a component comprising a plurality of semiconductor chips or three semiconductor chips that generate different-colored light radiations (for example, RGB, i.e., red, green and blue). In this case, it is possible for no conversion elements to be used, or for one or a plurality of conversion elements to be arranged only on one or a plurality of individual semiconductor chips (for example, to generate a green mixed radiation by radiation conversion of a blue primary radiation). In such a configuration, too, it is possible to use an (at least one) alignment opening in a leadframe of the component for precise alignment, for example, to position the component on a printed circuit board and position a secondary optical unit with respect to the component.

Although our components and methods have been more specifically illustrated and described in detail by preferred examples, nevertheless this disclosure is not restricted by the examples disclosed, and other variations may be derived therefrom by those person skilled in the art, without departing from the scope of protection of the disclosure.

This application claims priority of DE 10 2013 225 552.7, the subject matter of which is incorporated herein by reference.

The invention claimed is:

1. An optoelectronic component comprising a leadframe, a molded body connected to the leadframe, and an optoelectronic semiconductor chip arranged on the leadframe, wherein the leadframe comprises an alignment opening, and the molded body comprises a recess via which the leadframe is exposed in the area of the alignment opening.

2. The optoelectronic component according to claim 1, wherein the optoelectronic semiconductor chip is configured to generate a light radiation.

3. The optoelectronic component according to claim 1, wherein the alignment opening is circular.

4. The optoelectronic component according to claim 1, wherein the leadframe comprises a first leadframe section and a second leadframe section, and the optoelectronic semiconductor chip is arranged at least on the first leadframe section.

5. The optoelectronic component according to claim 4, wherein the alignment opening is formed at one of the first leadframe section and the second leadframe section.

6. The optoelectronic component according to claim 4, wherein the leadframe comprises a further leadframe section at which the alignment opening is formed.

7. The optoelectronic component according to claim 1, wherein the leadframe comprises a plurality of alignment openings.

8. The optoelectronic component according to claim 1, wherein the molded body comprises a further recess exposing the leadframe, within which further recess the optoelectronic semiconductor chip is arranged on the leadframe.

9. The optoelectronic component according to claim 1, wherein the leadframe comprises a plurality of leadframe sections constituting connection faces at a rear side of the optoelectronic component.

10. The optoelectronic component according to claim 9, wherein the alignment opening is located in the area of a connection face.

11. A method of producing an optoelectronic component according to claim 1, comprising:
    providing a leadframe comprising an alignment opening;
    forming a molded body connected to the leadframe, wherein the molded body comprises a recess via which the leadframe is exposed in the area of the alignment opening; and
    arranging an optoelectronic semiconductor chip on the leadframe.

12. The method according to claim 11, wherein, when arranging the optoelectronic semiconductor chip on the leadframe, the alignment opening of the leadframe aligns the optoelectronic semiconductor chip.

13. The method according to claim 11, wherein providing the leadframe comprises providing a metallic initial layer and structuring the metallic initial layer, and the alignment opening is formed during the structuring.

14. The method according to claim 13, wherein structuring comprises front-side and rear-side etching of the metallic initial layer, and the alignment opening is formed by the rear-side etching.

15. The method according to claim 11, wherein the molded body is formed such that the molded body comprises a further recess exposing the leadframe, and the optoelectronic semiconductor chip is arranged on the leadframe within the further recess.

16. An optoelectronic component comprising a leadframe, a molded body connected to the leadframe, and an optoelectronic semiconductor chip arranged on the leadframe, wherein the leadframe comprises an alignment opening, the molded body comprises a recess via which the leadframe is exposed in the area of the alignment opening, and the molded body comprises a further recess exposing the leadframe within which further recess the optoelectronic semiconductor chip is arranged on the leadframe.

* * * * *